(12) United States Patent
Carrillo et al.

(10) Patent No.: US 9,805,152 B1
(45) Date of Patent: Oct. 31, 2017

(54) COMPILATION OF SYSTEM DESIGNS

(71) Applicant: Xilinx, Inc., San Jose, CA (US)

(72) Inventors: Jorge E. Carrillo, San Jose, CA (US); Vinod K. Kathail, Palo Alto, CA (US); L. James Hwang, Portola Valley, CA (US); Sundararajarao Mohan, Sunnyvale, CA (US); Hua Sun, San Jose, CA (US)

(73) Assignee: XILINX, INC., San Jose, CA (US)

( * ) Notice: Subject to any disclaimer, the term of this patent is extended or adjusted under 35 U.S.C. 154(b) by 80 days.

(21) Appl. No.: 15/046,147

(22) Filed: Feb. 17, 2016

(51) Int. Cl.
*G06F 17/50* (2006.01)
(52) U.S. Cl.
CPC .................... *G06F 17/505* (2013.01)
(58) Field of Classification Search
CPC .. G06F 17/5054; G06F 17/5045; G06F 8/447; G06F 17/505
See application file for complete search history.

(56) References Cited

U.S. PATENT DOCUMENTS

| | | | | |
|---|---|---|---|---|
| 6,658,564 B1 * | 12/2003 | Smith | ................. | G06F 17/5054 712/15 |
| 8,762,916 B1 * | 6/2014 | Kathail | ............... | G06F 17/5045 326/37 |
| 8,775,986 B1 | 7/2014 | Mohan et al. | | |
| 9,075,624 B2 | 7/2015 | Carrillo | | |
| 9,223,921 B1 * | 12/2015 | Carrillo | .................. | G06F 8/447 |
| 9,613,123 B2 * | 4/2017 | Gupta | ................ | G06F 17/30592 |
| 9,652,570 B1 * | 5/2017 | Kathail | ............... | G06F 17/5045 |
| 2004/0088685 A1 * | 5/2004 | Poznanovic | ........ | G06F 17/5045 717/140 |

OTHER PUBLICATIONS

U.S. Appl. No. 14/845,100, Kathail, Vinod K., filed Sep. 3, 2015, Xilinx, Inc., San Jose, CA USA.
Introduction to SDSoC Environment, User Guide, UG1027, v2015. 2, Jul. 20, 2015, 81 pages, Xilinx, Inc., San Jose, CA USA.

* cited by examiner

*Primary Examiner* — Vuthe Siek
(74) *Attorney, Agent, or Firm* — LeRoy D. Maunu

(57) ABSTRACT

In an example implementation, a method is provided for compiling an HLL source file including function calls to one or more hardware accelerated functions. Function calls in the HLL source file to hardware accelerated functions are identified and grouped into a plurality of subsets for exclusive implementation in programmable logic resources. Sets of configuration data are generated for configuration of the programmable logic resources to implement hardware accelerated functions for the respective subsets of function calls. An interface manager is generated and the identified function calls are replaced with interface code configured to communicate with the interface manager. The interface manager manages configuration of the programmable logic resources to switch between the sets of configuration data to implement hardware accelerated functions for different ones of the subsets.

20 Claims, 6 Drawing Sheets

COMPILATION OF SYSTEM DESIGNS

TECHNICAL FIELD

The disclosure generally relates to the development of system designs using high-level languages (HLLs).

BACKGROUND

Programmable integrated circuits (ICs) may be programmed by a user to perform specified logic functions. One type of programmable IC, known as a field programmable gate array (FPGA), typically includes programmable logic resources that are arranged in an array of programmable tiles including, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Programmable ICs provide flexible hardware solutions that are advantageous for high performance parallel computing in advanced digital communications and video applications. For many complex applications, it may be desirable to implement a software portion of the design in software and a hardware portion of the design using programmable logic resources. Programmable ICs include one or more embedded processors to execute the software portion and programmable logic resources to implement circuits described by the hardware portion. Embedded processor systems often include operating memory, software instruction storage, input/output, and other components of a computer system. These systems are referred to as system on chip (SOC) solutions. In these systems, designers may implement complex functions in programmable logic to increase efficiency and throughput. This architectural combination gives an advantageous mix of serial and parallel processing, flexibility, and scalability, thereby enabling a more optimized system partitioning.

Current SOC digital hardware design is done using hardware description languages (HDLs) such as Verilog and VHDL. These languages provide special constructs to handle the description of digital hardware-specific elements such as registers and clocks. While these languages are effective in describing hardware circuits, they provide little in the way of high-level abstractions to manage the complexity of modern designs. In contrast, modern software languages, and in particular object-oriented high-level languages (HLL) such as Java and C++ provide robust high-level constructs that are very effective at managing complexity and serve to improve designer productivity as well as design quality. Synthesizing compilers have been created to infer and perform hardware synthesis to generate hardware circuits configured to implement an HLL design. The ability to describe circuits using an HLL allows a designer to focus on the algorithms, rather than the implementation details.

SUMMARY

In some implementations, a method is provided for compiling an HLL design having function calls to one or more hardware accelerated functions. Function calls to hardware accelerated functions are identified. Subsets of the identified function calls are determined for exclusive implementation of hardware accelerated functions in programmable logic resources of a programmable IC. Sets of configuration data are generated for configuration of the programmable logic resources to implement hardware accelerated functions for the respective subsets of function calls. An interface manager is generated and the identified function calls are replaced with interface code configured to communicate with the interface manager. The interface manager manages configuration of the programmable logic resources to switch between the sets of configuration data and thereby implement hardware accelerated functions for different ones of the subsets. A program executable on a processor of the programmable IC is generated from the HLL source file.

Systems are also disclosed for compiling an HLL system design having function calls to one or more hardware accelerated functions. The system includes a processor circuit and a memory circuit coupled to the processor circuit. The memory circuit stores a set of instructions that, when executed by the processor circuit, causes the processor circuit to generate code and circuit designs to use hardware accelerated versions of functions specified in an HLL source file. The instructions first cause the processor circuit to determine function calls in the HLL source file to map to hardware accelerated functions. A respective hardware implementation is specified for each hardware accelerated function in a hardware library.

The processor circuit determines subsets of the function calls for exclusive implementation of hardware accelerated functions on a set of programmable logic resources of a programmable IC. For each of the subsets, the processor generates a respective set of configuration data that programs the programmable logic resources to implement respective hardware implementations of hardware accelerated functions called by the subset of function calls. The instructions also cause the processor circuit to generate an interface manager and replace the identified function calls interface code configured to communicate with the interface manager. The interface manager manages configuration of the programmable logic resources to switch between the sets of configuration data and thereby implement hardware accelerated functions for different ones of the subsets. The instructions also cause the processor circuit generate a program executable on a processor of the programmable IC from the HLL source file.

Apparatuses are also disclosed that include programmable ICs configured to provide hardware accelerated functions. The apparatus includes a programmable IC having a set of programmable logic resources and a processor. The apparatus also includes a non-volatile memory coupled to the programmable IC. The non-volatile memory stores a program executable by the processor and a plurality of sets of configuration data. Each set of configuration data is configured to program the programmable logic resources to form hardware implementations of hardware accelerated functions for a respective subset of a plurality of function calls in the program to the hardware accelerated functions.

The program implements an interface manager and respective sets of interface code for the plurality of function calls to the hardware accelerated functions. The sets of interface code are configured to, when executed, provide a processing request to the interface manager. The processing request indicates one of the respective subsets of function calls. In response to receiving a processing request indicating one of the respective subsets of function calls, the interface manager is configured to cause the programmable logic resources to be programmed, using one of the plurality of sets of configuration data, to form hardware accelerated functions for the subset.

Other implementations will be recognized from consideration of the Detailed Description and Claims, which follow.

BRIEF DESCRIPTION OF THE DRAWINGS

Various aspects and features will become apparent upon review of the following detailed description and upon reference to the drawings, in which.

DETAILED DESCRIPTION

Figure 1:
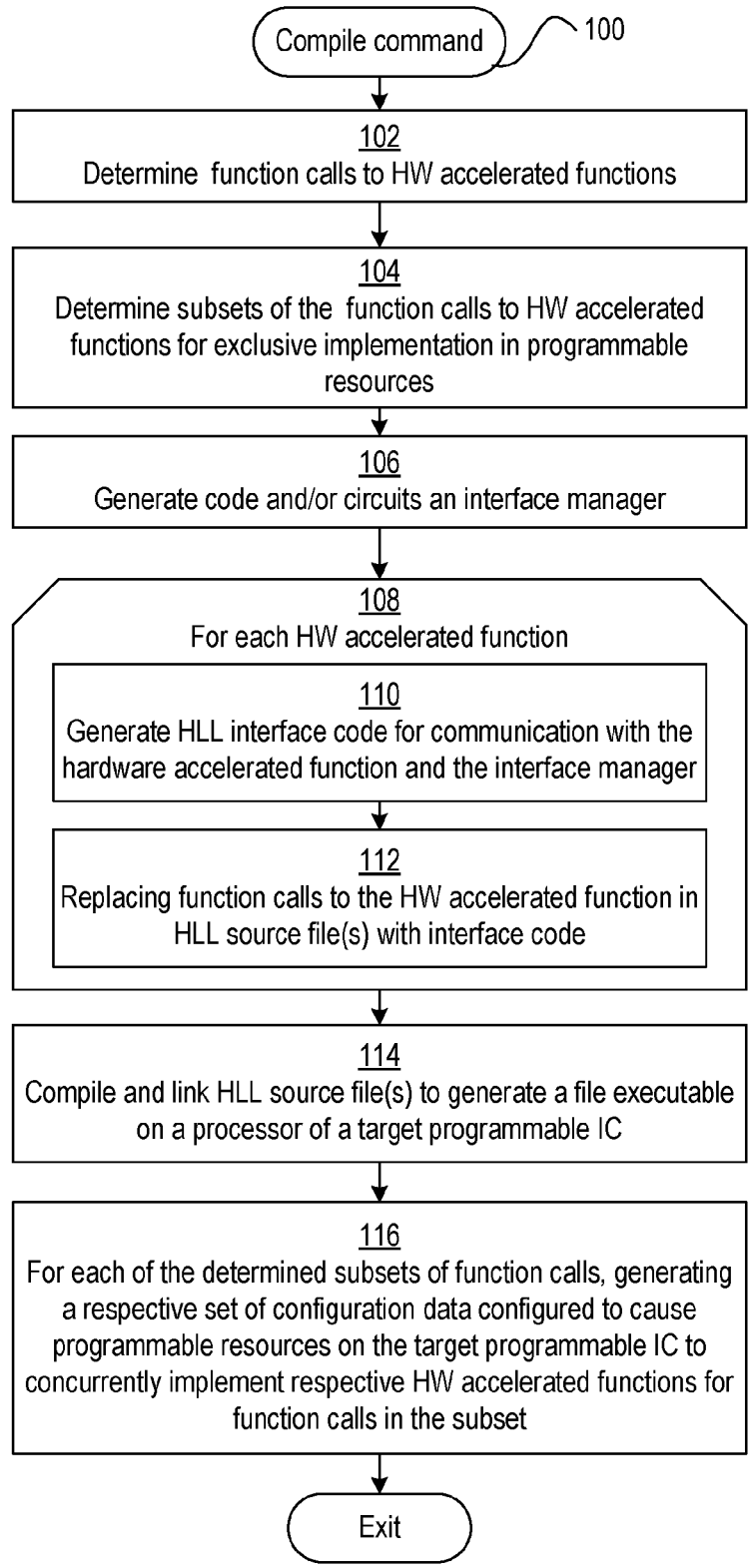
FIG. 1 shows a process for compiling HLL code including calls to one or more hardware-accelerated functions specified in an HLL library, consistent with one or more implementations.

Methods and systems are disclosed for compiling system designs in HLL programming languages (such as C or C++) that are to be implemented in devices that integrate processors with programmable logic resources (such as XILINX® Zynq® SOCs) without a need to write any hardware description language code (such as VHDL or Verilog) or any interface between them. More specifically, methods and systems are configured to compile an HLL design to implement a first portion of the HLL design using a processor of the SOC, and a second portion of the HLL design, providing a set of hardware accelerated functions, using programmable circuitry of the SOC.

Various implementations allow a user to invoke a hardware accelerated function via an HLL function call in an HLL source file. The user may use HLL function calls to the hardware accelerated function in the same manner as the user would call an HLL function in an HLL library. When the HLL source file is compiled, the compiler automatically retrieves files and information (e.g., from the HLL library) to implement the hardware accelerated function in programmable logic resources. The compiler also generates interface code and circuits for communication data between each hardware accelerated function and the HLL program.

In various implementations, the compiler generates an interface manager configured to program programmable logic resources on a programmable IC to form hardware implementations of the hardware accelerated functions for different subsets of function calls at different times. By dynamically reconfiguring programmable logic resources, hardware accelerated functions can be provided for a larger number of function calls. The interface manager may be implemented as a software process invoked by function calls in the HLL source code or as circuitry formed in a portion of the programmable logic resources.

In the compilation process, function calls in the HLL source file to hardware accelerated functions are identified. Subsets of the identified function calls are determined for exclusive implementation of hardware accelerated functions in programmable logic resources of a programmable IC. In some implementations, the subsets may be manually defined by a user via a GUI or commend line interface, within the HLL source file(s), and/or in a separate file (e.g., a directives file). Alternatively or additionally, the compiler may automatically determine the subsets for function calls for a number of functions selected for hardware acceleration but for which subsets have not been defined.

For each of the determined subsets, a respective set of configuration data is generated. The set of configuration data is configured to program the programmable logic resources to implement respective hardware implementations of hardware accelerated functions for the subset of function calls at the same time. The interface manager is configured to configure the programmable logic resources to switch between implementation of different ones of the sets of configuration data as needed by function calls to the hardware accelerated functions.

For each hardware accelerated function, the compiler generates a respective set of interface code to facilitate communicate with circuits forming the hardware accelerated function in programmable logic resources. Function calls in the HLL source file(s) to the hardware accelerated function are replaced with the generated interface code. When executed, the interface code is configured to provide a processing request to the interface manager. The processing request includes an identifier indicative of the set of the configuration data that implements the hardware accelerated function for the function call. If a set of configuration data indicated by the processing request is not currently implemented by the programmable logic resources, the interface manager initiates reconfiguration of the programmable logic resources using the set of configuration data indicated by the processing request. In some implementations, the processing request may uniquely identify a set of configuration data needed to implement the hardware accelerated function. Alternatively or additionally, the identifier may uniquely identify the function call that generated the processing request. The interface manager may determine, which set of configuration data is required by the function call using, for example, a lookup table.

Turning now to the figures, FIG. 1 shows a process for compiling an HLL program in accordance with one or more implementations. The process is initiated by a compile command 100 (e.g., terminal command or executable script command) indicating one or more HLL source files to be compiled. In response to the command 100, a processor circuit initiates execution of a compiler that determines function calls in the HLL source file(s) to hardware accelerated functions at block 102.

At block 104, the compiler executing on a processor circuit determines subsets of the determined function calls for exclusive implementation of hardware accelerated functions of each subset in programmable logic resources of a programmable IC. As previously described, in some various implementations, the subsets may be manually defined by a user or may be automatically determined for a number of functions selected by the user for hardware acceleration. As previously described, a user may manually define subsets of function calls via a GUI or command line interface, within the HLL source file(s), or within directive files. For example, subsets may be defined using pragmas in the HLL source file(s). The pragmas may be inserted at any point in which a function to be implemented as a hardware accelerated function is called. Example 1 shows an example set of pseudo code that may be used to define subsets of function calls using pragmas in an HLL source file. In this example, function "too" has no subset pragma, so it will be included in a default subset 0, the first call to the "bar" function will be included in subset 1, and the second call to the "bar" function will be included in subset 2.

```
int main(intargc, char **argv) {
  . . .
  foo(a, b, c);
  #pragma SDS subset (1)
  bar(c, d);
  #pragma SDS subset (2)
    bar(d, e);
  . . .
}
```

Example 1

Alternatively or additionally, in some implementations, the subsets may be automatically determined for a number of functions selected by the user for hardware acceleration. Functions selected for hardware acceleration may be specified, for example, in the HLL source file or as options in a compile command. In some implementations, the compiler may determine subsets of selected function calls, for example, as a function of available programmable logic resources on the programmable IC, resources required to form circuits for the hardware accelerated functions and resources required to route data between the hardware accelerated functions and a processor on the programmable IC. Additionally or alternatively, various other criteria may be used for selection of the subsets. For instance, the subsets may be selected to minimize reconfiguration time required during operation. As an illustrative example, a function call that is encountered frequently in the HLL source file may be included in several of the determined subsets.

At block 106, the compiler generates HLL code and/or circuit descriptions are for implementation of an interface manager. As previously described, the interface manager is configured to control reconfiguration of programmable logic resources on the programmable IC to implement hardware accelerated functions for different ones of the subsets of function calls at different times.

For each hardware accelerated function, the compiler supplements the HLL source file(s) with code at block 108. At block 110, the compiler generates a set of HLL interface code for communication with circuitry implementing the hardware accelerated function and with an interface manager. At block 112, the compiler replaces function calls in the HLL source file to the hardware accelerated function with the generated HLL interface code. As previously described, the interface code is configured to provide a processing request to the interface manager when executed. The processing request prompts the interface manager to reconfigure programmable logic resources, if necessary, to form hardware accelerated functions corresponding to the subset including the function call. The interface code is also configured to communicate data between memory locations corresponding to arguments of the function call and ports of the hardware accelerated function. The interface code also synchronizes processes performed by the HLL source file and the hardware implementation of the function. Alternatively, in some implementations, the synchronization of processes and/or communication of data between arguments of the function call and ports of the hardware accelerated function may be performed by the interface manager. At block 114, the modified HLL source file(s) are individually compiled and linked to generate a program executable on a processor of the target programmable IC.

At block 116, the compiler generates a respective set of configuration data for implementation of hardware accelerated functions for each subset. Each set of configuration data is configured to cause programmable logic resources to concurrently implement hardware accelerated functions for function calls of one of the subsets. The set of configuration data may also be configured to cause the programmable logic resources to also implement interface circuitry for routing signals between arguments of the HLL interface code and corresponding ports of the hardware accelerated functions. In different implementations, data may be communicated between the interface code and hardware accelerated functions using various communication protocols and/or communication circuits. For example, the interface circuitry may provide hardware buffered connections for communicating data between the memory locations for the HLL arguments and ports of the hardware implementation of the function. As another example, the interface circuitry may provide direction connections between ports mapped to the same argument to efficiently route the argument to the ports. In some implementations, the interface circuitry may include a direct memory access (DMA) communication circuit configured to perform read or write data transactions initiated by either the HLL code running on a processor or by the hardware implementation of the function.

Figure 2:
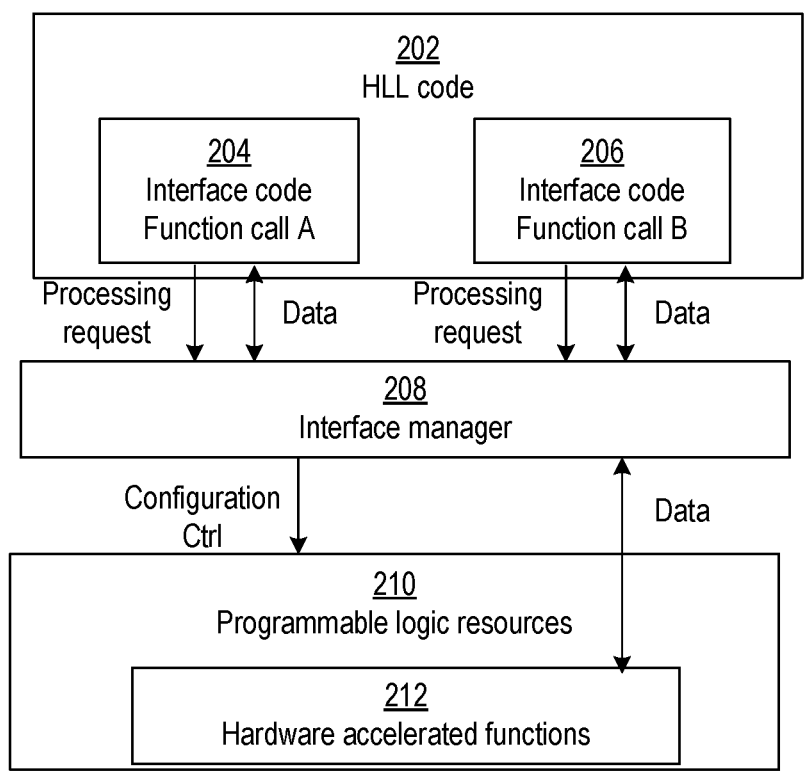
FIG. 2 illustrates data flow between an example set of modified HLL code, an interface manager, and a set of hardware accelerated functions during operation, consistent with one or more implementations.

FIG. 2 illustrates data flow between an example set of modified HLL code, an interface manager, and a set of hardware accelerated functions during operation, consistent with one or more implementations. As previously described, function calls in a set of HLL code 202 are replaced with respective sets of interface code 204 and 206. When a set of interface code 204 or 206 is encountered during execution of the HLL code 202 the interface code provides a processing request to the interface manager 208. As previously indicated, the processing request provides an indication of the subset that includes the function call corresponding to the set of interface code that issued the processing request. If hardware accelerated functions for the indicated subset are not currently implemented in programmable logic resources 210, the interface manager generates a configuration control signal to reconfigure the programmable logic resources 210 to implement hardware accelerated functions for the indicated subset.

In this example, data is communicated between the sets of interface code 204 and 206 and hardware accelerated functions in programmable logic resources via the interface manager. For example, the interface manager 208 may forward arguments of function calls to the sets of interface code 204 and 206. HLL code to corresponding ports of the hardware accelerated functions 212. Conversely, the interface manager 208 may provide result data from ports of the hardware accelerated functions 212 to corresponding arguments of the interface code 204 and 206. In some alternative implementations, the interface code 204 and 206 may be configured to independently communicate data between the HLL arguments and ports of the hardware accelerated functions 212 without forwarding of data by the interface manager 208. For example, when executed, the interface code 204 and 206 may provide a processing request to the interface manager and wait for a confirmation that the required hardware accelerated functions 212 have been implemented in programmable logic resources. After receiving confirmation, the interface code 204 and 206 may communicate data between HLL arguments and ports of the hardware accelerated functions 212.

Figure 3:
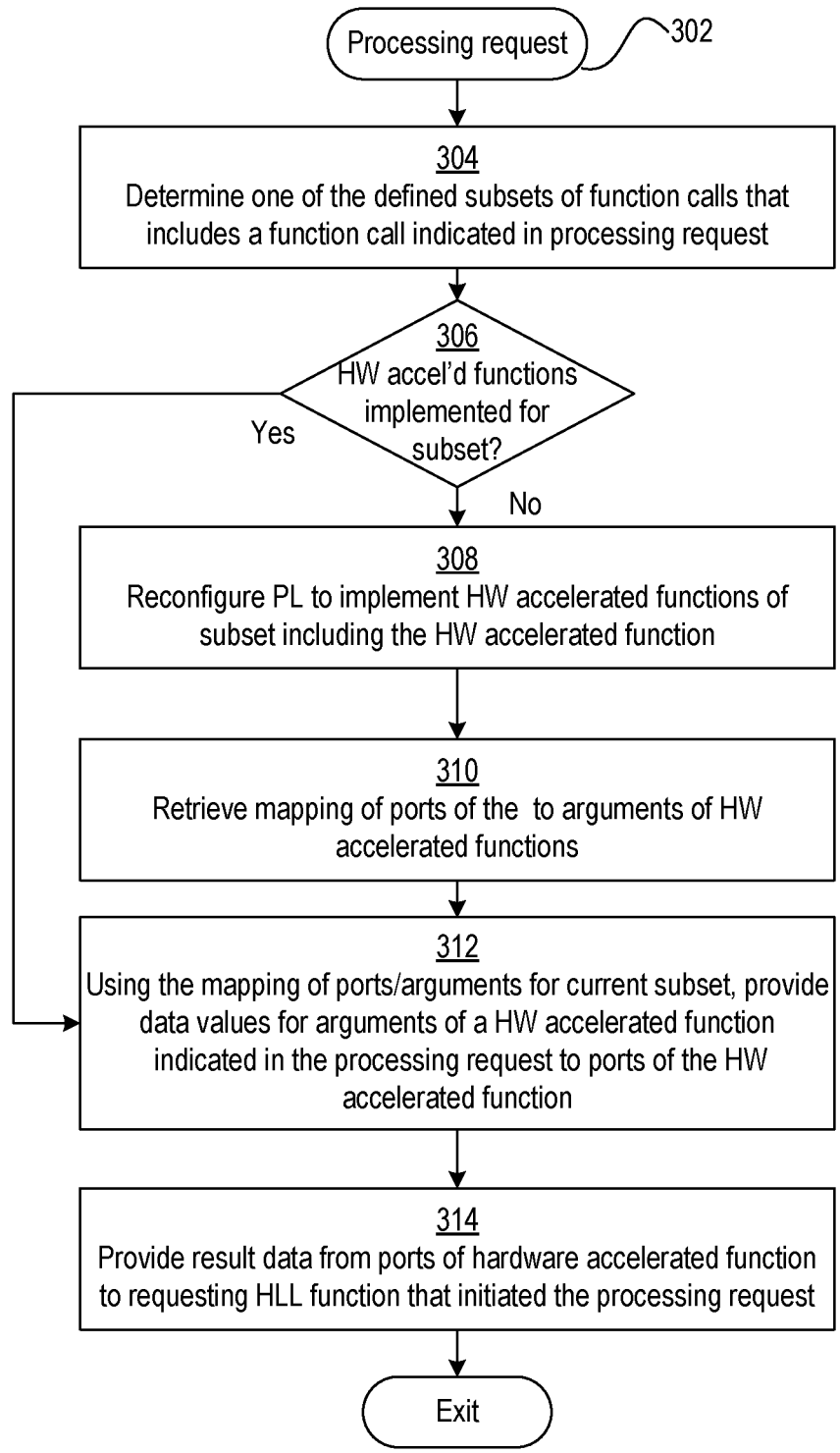
FIG. 3 shows an example process for managing reconfiguration of programmable logic resources for a plurality of subsets of function calls, consistent with one or more implementations.

FIG. 3 shows an example process performed by an interface manager, consistent with one or more implementations. The process is initiated in response to receiving a processing request 302. At block 304, the interface manager determines one of the defined subsets of function calls that include a function call indicated by the processing request. Alternatively, in some implementations, a required one of the defined subsets may be indicated in the processing request. If the programmable logic resources for one of the determined subsets are not currently programmed according to the determined set of configuration data, decision block 306 directs the process to block 308. At block 308, programmable logic resources are programmed to implement hardware accelerated function for the determined subset. At block 310, a mapping of HLL arguments for the determined subset of function calls to ports of the hardware accelerated functions is determined. In some implementations, interface circuits may also be configured at block 310 to route data between the ports and memory locations of HLL arguments according to the determined mapping.

In this example, after the programmable logic resources have been programmed to form hardware implemented functions for the subset of function calls indicated in the processing request, the process proceeds to block 312. At block 312, input data is communicated from memory locations for HLL arguments of the function call indicated in the processing request to ports of a hardware accelerated function according to the determined mapping. At block 314, result data is communicated from the ports of hardware accelerated to the memory locations for HLL arguments of the function call.

EXAMPLE 2 shows an example set of pseudo code that may be generated to manage reconfiguration of programmable logic resources for multiple defined subsets of function calls to hardware accelerated functions. In this example, the pseudo code is configured to manage configuration of programmable resource for three defined subsets of function calls (s0, s1, and s2). In this example, the pseudo code defines a data structure providing respective functions to open and close framework to facilitate communication with hardware accelerated functions for each subset of function calls. The framework may configure circuits for routing data between ports of hardware implemented function of the subset and corresponding HLL arguments. The pseudo code includes a function switch_to_next_subset(int subset_num) configured to facilitate implementation of hardware accelerated functions for a specified subset of function calls. If the current subset is the same as the specified subset, no action is taken. If the current subset is different than the specified subset, the function is configured to execute the close function for the current subset. A Linux command is executed to load configuration data in .bin file to a filepath /dev/xdevcfg for configuration of programmable logic resources of the programmable IC. Following configuration, the open function is executed for the open function for the new specified subset.

```
#define TOTAL_SUBSETS 3
int current_subset_num=0;
struct {
void (*open)( );
void (*close)( );
}
_table[TOTAL_SUBSETS]={
{.open=&_s0_cf_framework_open,
   .close=&_s0_cf_framework_close},
{.open=&_s1_cf_framework_open,  . close=&_s1_cf_framework_close},
{.open=&_s2_cf_framework_open,
   .close=&_s2_cf_framework_close},
}
void    switch_to_next_subset(int    subset_num)
{
 #ifdef_linux_if (current_subset_num!=subset_num)
   {
   _table[current_subset_num].close( );
   char buf[128];
   sprintf(buf, "cat/mnt/_sdi/_s%d_.bin>/dev/xdevcfg", subset_num);
   system(buf);
   _table[subset_num].open( )
   current_subset_num=subset_num;}
 #endif
}
```

Example 2

The interface manager, interface code and sets of configuration data may be generated for the subsets of function calls using various processes. In some implementations, HLL code and/or circuit designs may be automatically generated by executing a TCL script. In some other implementations, HLL code and/or circuit designs may be retrieved for example, from a library defining hardware-accelerated functions. For ease of reference, a library defining hardware-accelerated functions may be referred to as a hardware library.

As one example, the sets of configuration data may be generated by retrieving circuit designs from the hardware library that specify circuits to implement hardware accelerated functions for the defined subsets of function calls. The circuit designs may be specified as HDL code or as logical network list (netlist) for one or more target platforms. In some implementations, circuits for a hardware accelerated functions may be specified by HLL code that describes functionality to be implemented in hardware. If the circuit is specified as HLL code, the process may use an HLL synthesis tool to generate a netlist for a hardware implementation of the logic specified by HLL code.

As another example, the interface code may be generated by retrieving and modifying an interface code template included in the hardware library. The interface code template may include a function having the same arguments as an HLL function call to the hardware-accelerated function. In some implementations, the body of interface code template includes code to provide processing requests to the interface manager and facilitate communication data between the arguments and a respective port of the hardware implementation of the function. The communication code may include various parameters that may be reconfigured at compile time. For instance, parameters may be adjusted to accommodate various data lane width and/or protocols used to bridge and route signals to the hardware implementation of the function. In some other implementations, the body of the interface code template may be generated and added at compile time. HLL code for the interface manager may similarly be generated by retrieving and modifying an interface manager template included in the hardware library. The interface manager template may include a function configured to reconfigure programmable logic resources for a plurality of subsets as previously described with reference to FIG. 3.

For additional information regarding generation of code and circuits for communication between HLL code and circuits in programmable logic and/or synthesis of HDL circuits from HLL code, reference may be made to U.S. Pat. No. 8,762,916, titled AUTOMATIC GENERATION OF A DATA TRANSFER NETWORK; U.S. Pat. No. 8,775,986, titled SOFTWARE DEBUGGING OF SYNTHESIZED HARDWARE; and U.S. Pat. No. 9,075,624, titled METHOD FOR COMPILING PROGRAMS FOR PROCESSORS WITH PROGRAMMABLE LOGIC, which are fully incorporated by reference herein.

Figure 4:
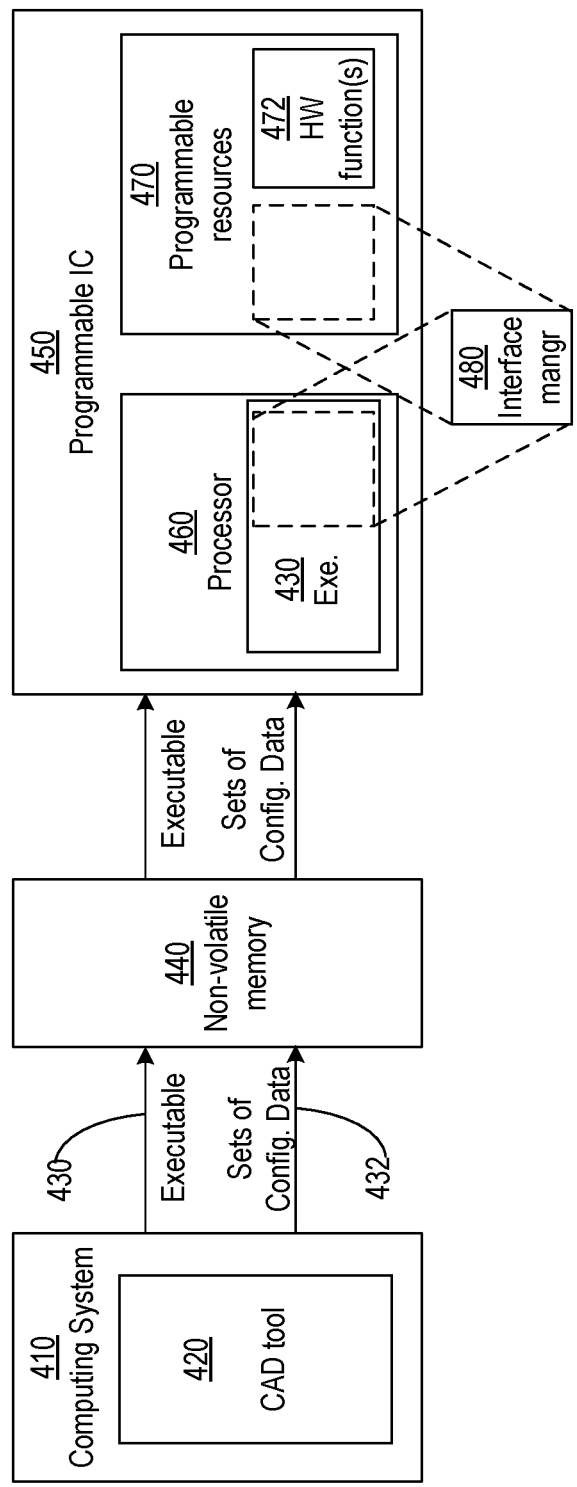
FIG. 4 shows an example system having a software-based circuit design tool configured for implementation of an HLL design on a programmable IC, consistent with one or more implementations.

FIG. 4 shows an example system, consistent with one or more implementations. The system includes a computing arrangement 410 configured to execute software that provides a computer assisted design (CAD) tool 420 for creation of HLL designs to be implemented on a target programmable IC 450 using a set of hardware accelerated functions. The CAD tool 420 is configured to identify and determine subsets of function calls in the HLL code to hardware accelerated functions for exclusive implementation in programmable logic resources 460 of the programmable IC 450, as described with reference to FIG. 1-3. The CAD tool 420 generates sets of configuration data 432 configured to program the programmable logic resources 470 to form circuits implementing hardware accelerated functions (e.g. 472) for the respective subsets of function calls.

For each hardware accelerated function, the CAD tool 420 generates a set of interface code for communication between the HLL code and the hardware accelerated function implemented in programmable logic resources 470. Functions calls to the hardware accelerated function are replaced with the generated interface code. The CAD tool 420 also generates HLL code and/or circuit descriptions (e.g., HDL and/or netlists) for an interface manager 480. As previously described, the interface manager 480 is configured to initiate reconfiguration of the programmable logic resources 470 to implementation hardware accelerated functions for different ones of the subsets function calls. As shown in FIG. 4, the interface manager 480 may be implemented as software executed by the processor 460, as circuitry implemented by programmable logic resources 470, or a combination thereof.

The CAD tool 420 compiles and links modified HLL source file(s) to produce an executable program 432 configured for execution by processor 460. The CAD tool 420 stores the executable program and generated sets of configuration data in a non-volatile memory 440 coupled to the programmable IC 450. When the programmable IC 450 is powered on, the executable program 430 is retrieved from the non-volatile memory 440 and executed by the processor 460. One of the sets of configuration data may also be retrieved from the non-volatile memory 440 and used for initial programing of the programmable logic resources 470. During operation, the interface manager 480 (implemented in the executable program or programmable logic resources) initiates reconfiguration of programmable logic resources 470, using the sets of configuration data, to implement hardware accelerated functions 472 for different subsets of function calls in the executable program 430 at different times, as previously described.

Figure 5:
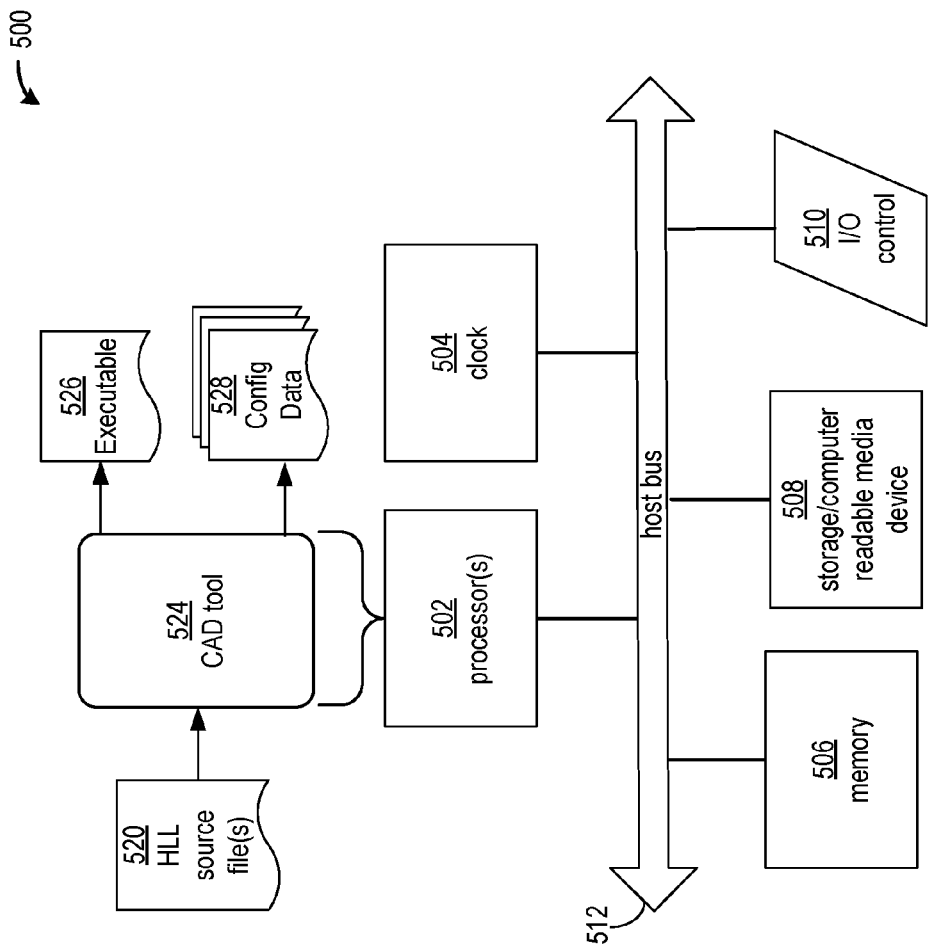
FIG. 5 shows a computing arrangement that may be used to perform one or more of the processes disclosed herein.

FIG. 5 shows a block diagram of an example computing arrangement that may be configured to implement the data structures and processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 500 includes one or more processors 502, a clock signal generator 504, a memory arrangement 506, and an input/output control unit 510, all coupled to a host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 502 may be one or more general purpose processors, or a combination of one or more general purpose processors and suitable co-processors, or one or more specialized processors (e.g., RISC, CISC, pipelined, etc.). The memory arrangement 506 typically includes multiple levels of cache memory, and a main memory. The memory arrangement 506 may include local and/or remote persistent storage, such as provided by magnetic disks (not shown), flash, EPROM, or other non-volatile data storage. The memory arrangement 506 may be read or read/write capable.

The processor(s) 502 executes the software in the memory arrangement 506, reads data from and stores data to the memory arrangement 506, and communicates with external devices through the input/output control arrangement 510. These functions are synchronized by the clock signal generator 504. The resources of the computing arrangement may be managed by either an operating system (not shown), or a hardware control unit (not shown).

In some implementations, the memory arrangement 506 stores a set of instructions that, when executed, cause the processor 502 to provide a CAD tool 524. The CAD tool 524 may provide a GUI configured to aid in the design, simulation and/or testing of circuit designs (e.g., custom circuit design 520 and shell circuit design 526). In some implementations, the CAD tool 524 may be configured to automatically compile an HLL source file for implementation on a programmable IC (e.g., 550 in FIG. 5) using one or more hardware accelerated functions. The CAD tool 524 may be configured to identify and determine subsets of function calls to hardware accelerated functions for exclusive implementation in programmable logic resources of the programmable IC. The CAD tool 524 generates sets of configuration data 528 for implementation of hardware accelerated functions for the respective subsets of function calls. The CAD tool supplements the HLL source file 520 with HLL code (e.g., interface code and/or interface manager) to communicate data between HLL function calls and hardware accelerated functions implemented by the sets of configuration data 528. The CAD tool compiles the supplemented HLL source file to produce a program executable on a processor (e.g., 460 in FIG. 4) of the programmable IC.

Those skilled in the art will appreciate that various alternative computing arrangements, including one or more processors and a memory arrangement configured with program code, would be suitable for hosting the processes and data structures disclosed herein. In addition, the processes may be provided via a variety of computer-readable storage media or delivery channels such as magnetic or optical disks or tapes, electronic storage devices, or as application services over a network.

Figure 6:
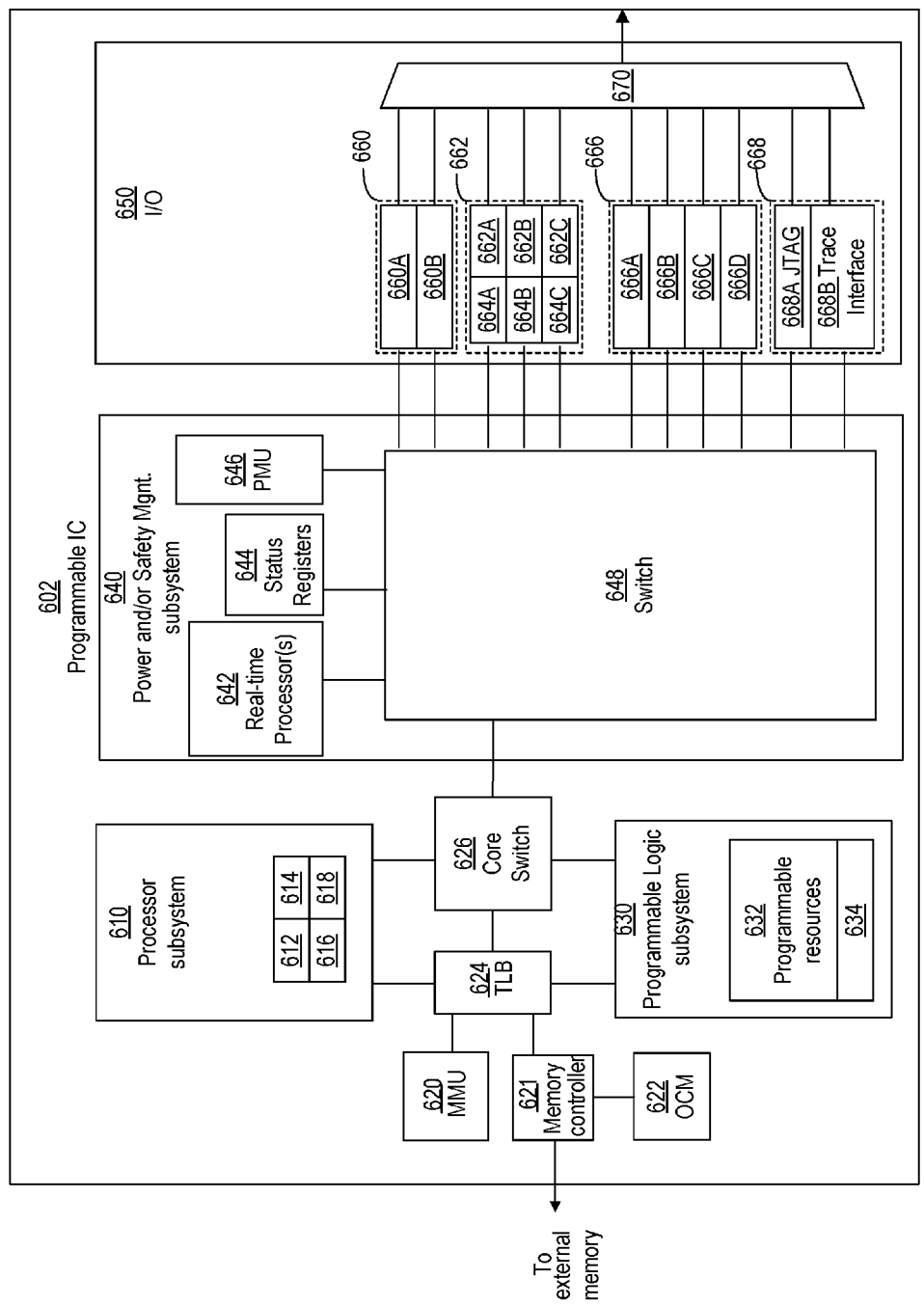
FIG. 6 shows a programmable IC that may be configured in accordance with one or more implementations.

FIG. 6 shows a programmable IC 602 that may be configured in accordance with one or more implementations. The programmable IC may also be referred to as a System On Chip (SOC), which includes a processor subsystem 610 and a programmable logic subsystem 630. The processor subsystem 610 may be programmed to implement a software portion of the user design, via execution of a user program. The program may be specified as part of a configuration data stream or may be retrieved from an on-chip or off-chip data storage device. The processor subsystem 610 may include various circuits 612, 614, 616, and 618 for executing one or more software programs. The circuits 612, 614, 616, and 618 may include, for example, one or more processor cores, floating point units (FPUs), an interrupt processing unit, on chip-memory, memory caches, and/or cache coherent interconnect.

The programmable logic subsystem 630 of the programmable IC 602 may be programmed to implement a hardware portion of a user design. For instance, the programmable logic subsystem may include a number of programmable logic resources 632, which may be programmed to implement a set of circuits specified in a configuration data stream. The programmable logic resources 632 include programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable logic resources 632 may be programmed by loading a configuration data stream into the configuration memory cells, which define how the programmable interconnect circuits and programmable logic circuits are configured. The collective states of the individual memory cells then determine the function of the programmable logic resources 632. The configuration data can be read from memory (e.g., from an external PROM) or written into the programmable IC 602 by an external device. In some implementations, configuration data may be loaded into configuration memory cells by a configuration controller 634 included in the programmable logic subsystem 630. In some other implementations, the configuration data may be loaded into the configuration memory cells by a start-up process executed by the processor subsystem 610.

The programmable IC 602 may include various circuits to interconnect the processor subsystem 610 with circuitry implemented within the programmable logic subsystem 630. In this example, the programmable IC 602 includes a core switch 626 that can route data signals between various data ports of the processor subsystem 610 and the programmable logic subsystem 630. The core switch 626 may also route data signals between either of the programmable logic or processing subsystems 610 and 630 and various other circuits of the programmable IC, such as an internal data bus. Alternatively or additionally, the processor subsystem 610 may include an interface to directly connect with the programmable logic subsystem—bypassing the core switch 626. Such an interface may be implemented, for example, using the AMBA AXI Protocol Specification (AXI) as published by ARM.

In some implementations, the processor subsystem 610 and the programmable logic subsystem 630 may also read or write to memory locations of an on-chip memory 622 or off-chip memory (not shown) via memory controller 621.

The memory controller 621 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 621 is able to communicate is provided for purposes of illustration only and is not intended as a limitation or to be exhaustive. As shown in FIG. 6, the programmable IC 602 may include a memory management unit 620 and translation look-aside buffer 624 to translate virtual memory addresses used by the subsystems 610 and 630 to physical memory addresses used by the memory controller 621 to access specific memory locations.

The programmable IC may include an input/output (I/O) subsystem 650 for communication of data with external circuits. The I/O subsystem 650 may include various types of I/O devices or interfaces including for example, flash memory type I/O devices, higher performance I/O devices, lower performance interfaces, debugging I/O devices, and/or RAM I/O devices.

The I/O subsystem 650 may include one or more flash memory interfaces 660 illustrated as 660A and 660B. For example, one or more of flash memory interfaces 660 can be implemented as a Quad-Serial Peripheral Interface (QSPI) configured for 4-bit communication. One or more of flash memory interfaces 660 can be implemented as a parallel 8-bit NOR/SRAM type of interface. One or more of flash memory interfaces 660 can be implemented as a NAND interface configured for 8-bit and/or 16-bit communication. It should be appreciated that the particular interfaces described are provided for purposes of illustration and not limitation. Other interfaces having different bit widths can be used.

The I/O subsystem 650 can include one or more interfaces 662 providing a higher level of performance than flash memory interfaces 660. Each of interfaces 662A-662C can be coupled to a DMA controller 664A-664C respectively. For example, one or more of interfaces 662 can be implemented as a Universal Serial Bus (USB) type of interface. One or more of interfaces 662 can be implemented as a gigabit Ethernet type of interface. One or more of interfaces 662 can be implemented as a Secure Digital (SD) type of interface.

The I/O subsystem 650 may also include one or more interfaces 666 such as interfaces 666A-666D that provide a lower level of performance than interfaces 662. For example, one or more of interfaces 666 can be implemented as a General Purpose I/O (GPIO) type of interface. One or more of interfaces 666 can be implemented as a Universal Asynchronous Receiver/Transmitter (UART) type of interface. One or more of interfaces 666 can be implemented in the form of a Serial Peripheral Interface (SPI) bus type of interface. One or more of interfaces 666 can be implemented in the form of a Controller-Area-Network (CAN) type of interface and/or an $I^2C$ type of interface. One or more of interfaces 666 also can be implemented in the form of a timer type of interface.

The I/O subsystem 650 can include one or more debug interfaces 668 such as processor JTAG (PJTAG) interface 668A and a trace interface 668B. PJTAG interface 668A can provide an external debug interface for the programmable IC 602. Trace interface 668B can provide a port to receive debug, e.g., trace, information from the processor subsystem 610 or the programmable logic subsystem 630.

As shown, each of interfaces 660, 662, 666, and 668 can be coupled to a multiplexer 670. Multiplexer 670 provides a plurality of outputs that can be directly routed or coupled to external pins of the programmable IC 602, e.g., balls of the package within which the programmable IC 602 is disposed. For example, I/O pins of programmable IC 602 can be shared among interfaces 660, 662, 666, and 668. A user can configure multiplexer 670, via a configuration data stream to select which of interfaces 660-668 are to be used and, therefore, coupled to I/O pins of programmable IC 602 via multiplexer 670. The I/O subsystem 650, may also include a fabric multiplexer I/O (FMIO) interface (not shown) to connect interfaces 662-668 to programmable logic circuits of the programmable logic subsystem. Additionally or alternatively, the programmable logic subsystem 630 can be configured to implement one or more I/O circuits within programmable logic. In some implementations, the programmable IC 602 may also include a subsystem 640 having various circuits for power and/or safety management. For example, the subsystem 640 may include a power management unit 646 configured to monitor and maintain one or more voltage domains used to power the various subsystems of the programmable IC 602. In some implementations, the power management unit 646 may disable power of individual subsystems, when idle, to reduce power consumption, without disabling power to subsystems in use.

The subsystem 640 may also include safety circuits to monitor the status of the subsystems to ensure correct operation. For instance, the subsystem 640 may include one or more real-time processors 642 configured to monitor the status of the various subsystems (e.g., as indicated in status registers 644). The real-time processors 642 may be configured to perform a number of tasks in response to detecting errors. For example, for some errors, the real-time processors 642 may generate an alert in response to detecting an error. As another example, the real-time processors 642 may reset a subsystem to attempt to restore the subsystem to correct operation. The subsystem 640 includes a switch network 648 that may be used to interconnect various subsystems. For example, the switch network 648 may be configured to connect the various subsystems 610, 630, and 640 to various interfaces of the I/O subsystem 650. In some applications, the switch network 648 may also be used to isolate the real-time processors 642 from the subsystems that are to be monitored. Such isolation may be required by certain application standards (e.g., IEC-61508 SIL3 or ISO-26262 standards) to ensure that the real-time processors 642 are not affected by errors that occur in other subsystems.

The methods and systems are thought to be applicable to a variety of applications. Other aspects and features will be apparent to those skilled in the art from consideration of the specification. For example, though aspects and features may in some cases be described in individual figures, it will be appreciated that features from one figure can be combined with features of another figure even though the combination is not explicitly shown or explicitly described as a combination. It is intended that the specification and drawings be considered as examples only, with a true scope of the invention being indicated by the following claims.

What is claimed is:

1. A method, comprising:
   performing on a programmed processor operations including:
   receiving a command that indicates an high-level language (HLL) source file to be compiled, the HLL source file including function calls to a set of hardware accelerated functions, each hardware accelerated function of the set having a respective hardware implementation specified in a hardware library;
   determining subsets of the function calls to the set for mutually exclusive implementation on a set of programmable logic resources of a programmable integrated circuit (IC);
   for each of the subsets of the function calls, generating a respective set of configuration data that programs the set of programmable logic resources to implement respective instances of the hardware implementations for the subset of function calls;
   generating an interface manager configured to manage configuration of the set of programmable logic resources to switch between the respective sets of configuration data for implementation of the subsets of the function calls in the set of programmable logic resources;
   replacing the function calls to the hardware accelerated functions with respective sets of interface code, configured to communicate with the interface manager, to produce a modified HLL source file; and
   generating from the modified HLL source file, a program executable on a processor of the programmable IC.

2. The method of claim 1, wherein:
   the interface manager is further configured to communicate data between the sets of interface code for the function calls and the hardware implementations of the hardware accelerated functions; and
   the sets of interface code are configured to, when executed, provide a processing request to the interface manager, the processing request indicating an identifier (ID) of an instance of the interface code providing the processing request, an ID of the hardware accelerated function, and a set of arguments to be processed by the hardware accelerated function.

3. The method of claim 2, wherein the interface manager is configured to, in response to the interface manager receiving the processing request, cause the programmable logic resources to implement one of the subsets that includes a hardware implementation of the hardware accelerated function having the ID indicated by the processing request.

4. The method of claim 1, wherein the subsets of the hardware accelerated functions are defined in the HLL source file.

5. The method of claim 1, wherein the determining of the subsets is performed as a function of the amount of programmable logic resources required to implement each of the hardware accelerated functions.

6. The method of claim 1, wherein generation of the interface manager includes:
   generating a circuit design configured to operate as the interface manager; and
   wherein the generating of the respective set of configuration data is configured to cause programmable logic resources to also implement circuitry specified by the generated circuit design.

7. The method of claim 1, wherein generation of the interface manager includes:
   generating a set of HLL code configured to operate as the interface manager when executed; and
   supplementing the modified HLL source file to include the generated set of HLL code.

8. The method of claim 1, further comprising retrieving the respective sets of interface code from a library.

9. The method of claim 1, wherein the generating the respective set of configuration data for one of the subsets includes:

mapping arguments in the function calls for the hardware accelerated functions of the subset to ports of the hardware implementations of the hardware accelerated functions; and creating netlist connections between ports of hardware implementations of the hardware accelerated functions that are mapped to the same argument.

10. The method of claim 1, wherein the hardware implementation of at least one of the set of hardware accelerated functions is specified as a netlist.

11. The method of claim 10, wherein:
the hardware implementation of at least one of the set of hardware accelerated functions is specified in an HDL or an HLL; and
the generating of the set of configuration data includes elaborating and synthesizing the hardware accelerated functions specified in the HDL or the HLL.

12. A system, comprising:
a processor circuit;
a memory circuit coupled to the processor circuit, the memory circuit storing a set of instructions that, when executed by the processor circuit, cause the processor circuit to:
determine function calls in an high-level language (HLL) source file to a set of hardware accelerated functions, each hardware accelerated function of the set having a respective hardware implementation specified in a hardware library;
determine subsets of the function calls for mutually exclusive implementation on a set of programmable logic resources of a programmable integrated circuit (IC);
for each of the subsets of the function calls, generate a respective set of configuration data that programs the set of programmable logic resources to implement respective instances of the hardware implementations for the subset of the function calls;
generate an interface manager configured to manage configuration of the set of programmable logic resources to switch between the respective sets of configuration data for implementation in the set of programmable logic resources;
replace the function calls to the hardware accelerated functions with respective sets of interface code, configured to communicate with the interface manager, to produce a modified HLL source file; and
generate from the modified HLL source file a program executable on a processor of the programmable IC.

13. The system of claim 12, wherein:
the interface manager is further configured to communicate data between interface code for the function calls and the hardware implementations of the hardware accelerated functions; and
the sets of interface code are configured to, when executed, provide a processing request to the interface manager, the processing request indicating an identifier (ID) of an instance of the interface code providing the processing request, an ID of the hardware accelerated function, and a set of arguments to be processed by the hardware accelerated function.

14. The system of claim 13, wherein the interface manager is configured to, in response to the interface manager receiving the processing request, cause the programmable logic resources to implement one of the subsets that includes a hardware implementation of the hardware accelerated function having the ID indicated by the processing request.

15. The system of claim 12, wherein the subsets of the hardware accelerated functions are defined in the HLL source file.

16. The system of claim 12, wherein the set of instructions further cause the processor circuit to determine of the subsets based on an amount of programmable logic resources required to implement each of the hardware accelerated functions.

17. The system of claim 12, wherein generation of the interface manager includes:
generating a circuit design configured to operate as the interface manager; and
wherein the generating of the respective set of configuration data is configured to cause programmable logic resources to also implement circuitry specified by the generated circuit design.

18. The system of claim 12, wherein the set of instructions further cause the processor circuit to generate the interface manager by:
retrieving a code template from a library;
for each hardware accelerated function supplementing the code template with code configured and arranged to communicate data between arguments of a function call identifying the hardware accelerated function and ports of the hardware implementation of the hardware accelerated function; and
adding the supplemented code template to the modified HLL source file.

19. The system of claim 12, wherein the set of instructions further cause the processor circuit to generate the respective set of configuration data for one of the subsets by:
mapping arguments in the function calls for the hardware accelerated functions of the subset to ports of the hardware implementations of the hardware accelerated functions; and
creating netlist connections between ports of hardware implementations of the hardware accelerated functions that are mapped to the same argument.

20. An apparatus, comprising:
a programmable integrated circuit (IC) including a set of programmable logic resources and a processor; and
a non-volatile memory coupled to the programmable IC and storing:
a program executable by the processor,
a plurality of sets of configuration data, each set of configuration data configured to program the programmable logic resources to form hardware implementations of hardware accelerated functions for a respective subsets of a plurality of function calls to the hardware accelerated functions in the program; and
wherein the program implements:
respective sets of interface code for the plurality of function calls to the hardware accelerated functions, wherein the sets of interface code are configured to, when executed, provide a processing request to an interface manager, the processing request indicating one of the respective subsets of the function calls; and
the interface manager, wherein in response to receiving a processing request indicating one of the respective subsets of the function calls, the interface manager is configured to program the programmable logic resources to form hardware accelerated functions for the subset, using one of the plurality of sets of configuration data.

* * * * *